United States Patent
Ohashi et al.

(10) Patent No.: US 8,350,989 B2
(45) Date of Patent: Jan. 8, 2013

(54) LIQUID CRYSTAL DISPLAY DEVICE

(75) Inventors: Shigeo Ohashi, Tsuchiura (JP);
Yoshiharu Yamashita, Yokohama (JP);
Katsunari Sato, Toda (JP)

(73) Assignee: Hitachi Consumer Electronics Co., Ltd., Tokyo (JP)

( * ) Notice: Subject to any disclaimer, the term of this patent is extended or adjusted under 35 U.S.C. 154(b) by 415 days.

(21) Appl. No.: 12/782,183

(22) Filed: May 18, 2010

(65) Prior Publication Data

US 2011/0063543 A1 Mar. 17, 2011

(30) Foreign Application Priority Data

Sep. 11, 2009 (JP) ................. 2009-209926

(51) Int. Cl.
*G02F 1/1335* (2006.01)
*G09F 13/04* (2006.01)
(52) U.S. Cl. ......... 349/65; 349/158; 362/97.1; 362/97.2
(58) Field of Classification Search ............ 349/20, 349/22, 41, 42, 43, 50, 56, 61, 72, 149, 158, 349/161, 65; 362/97.1, 97.2, 97.3, 97.4
See application file for complete search history.

(56) References Cited

U.S. PATENT DOCUMENTS

| 7,667,378 B2 * | 2/2010 | Sakai | 313/46 |
| 2004/0042180 A1 | 3/2004 | Yamaguchi | |
| 2007/0221941 A1 | 9/2007 | Jeong et al. | |
| 2007/0242462 A1 | 10/2007 | Van Laanen et al. | |
| 2008/0043194 A1 | 2/2008 | Lin et al. | |
| 2008/0111944 A1 * | 5/2008 | Sakai | 349/61 |
| 2009/0003398 A1 * | 1/2009 | Moto | 372/36 |
| 2011/0063543 A1 * | 3/2011 | Ohashi et al. | 349/65 |

FOREIGN PATENT DOCUMENTS

| JP | 2006-100483 | 4/2006 |
| JP | 2006-235399 | 9/2006 |
| JP | 2006-308738 | 11/2006 |
| JP | 2006-344472 | 12/2006 |

* cited by examiner

*Primary Examiner* — Brian Healy
(74) *Attorney, Agent, or Firm* — Antonelli, Terry, Stout & Kraus, LLP.

(57) ABSTRACT

Each of plural light source units is formed by combining a light source formed of plural light emitting elements mounted on a wiring substrate with a light guide plate having a side surface serving as a light incident surface. The wiring substrate is attached to the chassis such that the light output surface of the light emitting element is perpendicular to the light emitting element mount surface of the wiring substrate. The wiring patterns each with the larger width than that of the electrode are formed on both upper and back surfaces of the substrate at the portion to which the power feeding electrode of the light emitting element is soldered. They are connected via the through holes which are arranged in plural rows around the electrode.

4 Claims, 5 Drawing Sheets

FIG. 6B
SECTION ALONG A-A

FIG. 6C
SECTION ALONG B-B

FIG. 6D

LIQUID CRYSTAL DISPLAY DEVICE

BACKGROUND OF THE INVENTION (1) Field of the Invention

The present invention relates to a liquid crystal display device capable of efficiently rejecting heat generated inside a casing.

(2) Description of the Related Art

Recently, a luminous type plasma display device and a non-luminous type liquid crystal display device have been increasingly used as the display device in place of the CRT (Cathode Ray Tube).

The liquid crystal display device employs the liquid crystal panel as the transmission type light modulation device, having a back surface equipped with a lighting device (hereinafter referred to as a backlight device) for irradiating light rays to the liquid crystal panel. The liquid crystal panel controls transmittance of the light irradiated from the backlight device to form an image.

Mainly, there are two types of the backlight device for irradiating the light to the liquid crystal panel. One is a side-light type having the light source disposed at lateral or longitudinal ends of the liquid crystal panel for irradiating the light via a light guide plate which serves to output the incident light from the side surface toward the plane, and the other is down type for irradiating the light from the back surface of the liquid crystal panel.

The liquid crystal display device has a feature capable of forming a thin external configuration. Recent trend demands the device to be further thin and to reduce the power consumption. If the thickness of the liquid crystal display device is reduced excessively, it becomes difficult to form the air passage for rejecting the heat generated inside the casing that forms the external configuration of the liquid crystal display device. As a result, the heat cannot be efficiently rejected, thus increasing the temperature at the heat sensitive spot.

Patent Documents 1 to 3, that is, JP-A Nos. 2006-235399, 2006-308738 and 2006-344472 disclose the use of LED (Light Emitting Diode) as the light source for the backlight device of the side-light type liquid crystal display device, and the structure for releasing the heat from the back surface of the substrate provided with the light source connected to the heat release member so as to discharge the heat generated in the LED.

The side-light type backlight device for irradiating the light to the liquid crystal panel is likely to have the light sources concentrated at end portions of the screen. It is therefore difficult to release the heat from the light source or perform cooling, for example, to control illuminance of the light source in accordance with the image signal, and enlarge the structure compared with the down type backlight device.

Especially when the liquid crystal display device is intended to have its size diversified from small size to large size, the light guide plate optically designed and sized in accordance with the screen size is required. It is difficult to utilize the common parts, thus interfering cost reduction.

The down type employs more light sources than the side-light type, increasing the cost and power consumption. The down type requires the distance from the light source to the liquid crystal panel (that is, the distance of the liquid crystal panel in the thickness direction) to be increased for the purpose of suppressing uneven brightness of the image to be displayed on the liquid crystal panel, which is disadvantageous for reducing the thickness of the liquid crystal display device. Furthermore, the distance from the light source to the liquid crystal panel makes it difficult to provide high contrast ratio under the light source control.

SUMMARY OF THE INVENTION

The present invention provides the liquid crystal display device capable of improving heat releasing performance and image quality universally irrespective of the screen size while allowing reduction of the thickness of the liquid crystal display device.

The liquid crystal display device according to the present invention includes a liquid crystal panel, a light source unit formed by combining a light guide plate which accommodates light rays from a side surface for illuminating a back surface of the liquid crystal panel with a light source, and a chassis for holding the light source unit. The light source is formed by mounting plural light emitting elements each provided with a power feeding electrode on a surface perpendicular to a light output surface on a wiring substrate. The wiring substrate is provided with an electrode pad connected to an electrode of the light emitting element, a wiring pattern which includes the electrode pad, having a width larger than that of the electrode pad, and is formed on both upper and back surfaces of the substrate, and through holes formed around the electrode pad in plural rows for connecting the wiring patterns formed on both the upper and back surfaces of the substrate. The wiring patterns on both the upper and back surfaces of the wiring substrate, which is on a surface different from a light emitting element mount surface is thermally connected to the chassis.

In the liquid crystal display device, the width of the wiring pattern formed on both the upper and back surfaces of the wiring substrate is at least several times the width of the electrode of the light emitting element, and the wiring patterns each with the same shape are formed at corresponding positions on both the upper and back surfaces, respectively.

In the liquid crystal display device, the through holes are arranged so as not to be formed in the electrode pad.

In the liquid crystal display device, the light source for forming the light source unit is formed of a row of the linearly arranged light emitting elements as a unit. One or more units of the light emitting element rows are two dimensionally arranged and mounted on the same wiring substrate. Plural wiring substrates are attached to the chassis by arranging so that the light emitting element mount surface is positioned parallel to a display surface of the liquid crystal panel.

The present invention provides technology which satisfies requirements with respect to heat releasing performance, improvement of image quality, reduction of power consumption, high reliability, and cost reduction irrespective of the screen size while allowing the thickness reduction of the liquid crystal display device.

DESCRIPTION OF THE PREFERRED EMBODIMENTS

The best mode for carrying out the present invention will be described referring to the drawings.

Figure 1:
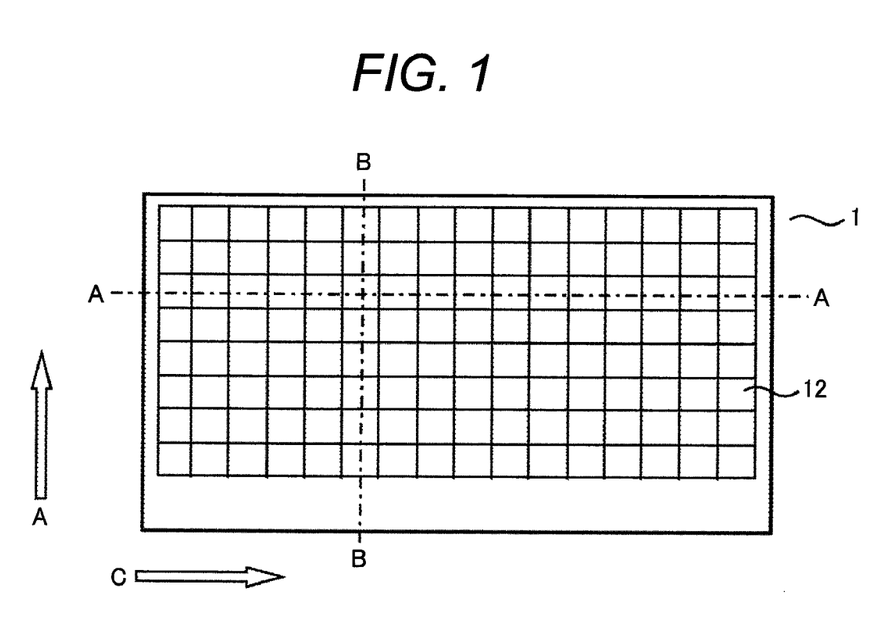
FIG. 1 is a view of a first embodiment of a liquid crystal display device, illustrating an inner portion of the device seen from the front.
Figure 2A:
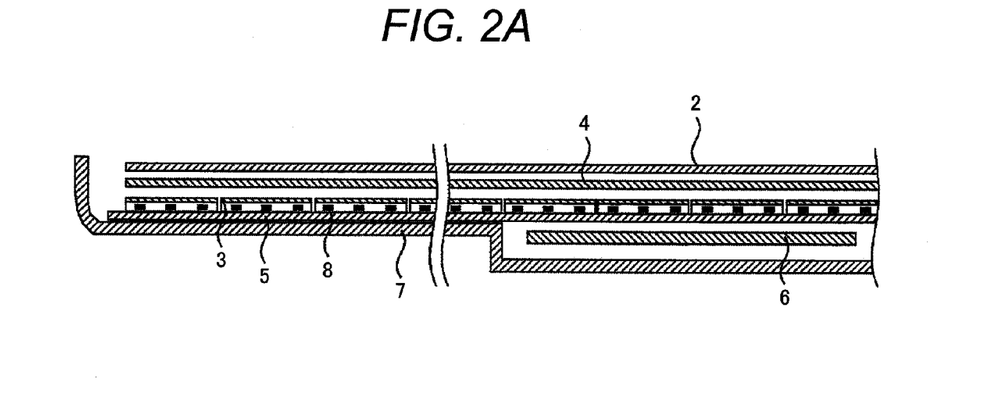
FIG. 2A is a sectional view taken along line A-A of FIG. 1.
Figure 2B:
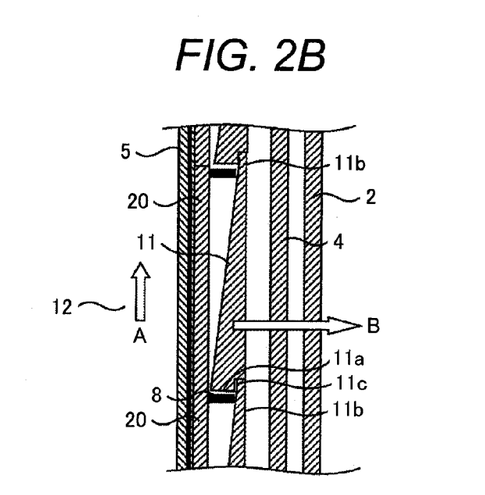
FIG. 2B is a sectional view taken along line B-B of FIG. 1.

FIGS. 1, 2A and 2B illustrate a liquid crystal television as an example of a liquid crystal display device according to the present invention. FIG. 1 is a front view of an inner portion of the liquid crystal television 1 according to a first embodiment.

FIG. 2A is a partially enlarged sectional view taken along line A-A of FIG. 1. FIG. 2B is a partially enlarged sectional view taken along line B-B of FIG. 1.

Referring to FIG. 2A, the liquid crystal television of the embodiment includes a liquid crystal panel 2 as a passive display device, a backlight unit 3 for irradiating light rays to the liquid crystal panel 2, and an optical sheet 4 interposed between the liquid crystal panel 2 and the backlight unit 3 for diffusing the light ray irradiated from the backlight unit 3. The liquid crystal panel 2 may be provided with a color filter, and structured as monochrome type, IPS (In Plane Switching) type, VA (Vertical Alignment) type and the like. The backlight unit 3 is assembled with a chassis 5 formed of metal such as an aluminum plate and a steel plate. A circuit substrate 6, for example, a signal control circuit, a power circuit, and a panel drive circuit is mounted on the back surface of the chassis 5. A casing 7 stores the aforementioned elements to form the liquid crystal television. FIG. 2A illustrates the single optical sheet 4. Actually, however, it is formed by combining any of the diffusion sheet, prism sheet, diffusion plate, and a polarization selective reflection film. The aforementioned sheet partially reflects the light from a light source 8 so as to be reflected to the backlight unit 3. The light reflected from the backlight unit 3 again transmits and diffuses. It is therefore effective for improving brightness uniformity.

Referring to FIG. 2B, the backlight unit 3 includes a light source unit 12 formed by combining a light source 8 which includes plural light emitting elements such as light-emitting diode (LED) mounted on a wiring substrate 20 with a light guide plate 11 which receives incident light discharged from the light source toward a direction of arrow A (that is, the direction parallel to the liquid crystal panel 2), and outputs the incident light skewed toward a direction of arrow B (that is, the direction orthogonal to the display surface of the liquid crystal panel 2) so as to guide the light to the liquid crystal panel 2 disposed to the front of the backlight unit 3.

Specifically, the light source unit 12 includes a light source formed by mounting a unit of plural LEDs 8 arranged on the same line (vertical direction in FIG. 2B) on the wiring substrate 20, and the light guide plate 11 disposed corresponding to the light source. The plural light source units 12 are arranged in directions of arrow A and arrow C, that is, in the direction parallel to the display surface of the liquid crystal panel 2 as shown in FIG. 1. The illuminance of the light source 8 (intensity of the light released from the light source 8) may be controlled for each unit of the light source of the light source units 12 based on the brightness information of the video signal via the circuit substrate 6. In such a case, lightness and color of the video image displayed on the liquid crystal panel 2 may be locally controlled corresponding to the light source unit 12.

Contrast and color purity of the resultant displayed video image may be improved. The larger the number of the light source units 12 becomes, the more detailed the control becomes. As illustrated in FIG. 1, for example, in the case where 8 units and 16 units of the light source units 12 are disposed in the directions of arrows A and C, respectively, the display region of the liquid crystal panel 2 is divided into 128 sections corresponding to the respective light source units 12. The lightness and color may be controlled for each divided region. It is clearly understood that the number of the light source units 12 (the number of divided display regions) is not limited to the one as described above.

As described above, the control may be executed in more detail by increasing the number of the light source units 12. However, excessive number of those units may largely increase the number of parts and costs. It is therefore preferable to set the appropriate number of the light source units in accordance with the size of the liquid crystal panel 2. The backlight unit 3 is divided and arranged corresponding to the respective light source units 12 so as to control brightness and color for each divided region. This allows the brightness control for the desired region to be easily executed under the area control, resulting in the backlight unit 3 capable of providing high quality video image with high contrast while reducing the power consumption. Furthermore, the light source units 12 may be commonly used irrespective of change in the screen size, and accordingly, the screen size may be diversified at lower costs.

The light source unit according to the embodiment will be described in detail referring to FIGS. 3A and 3B.

Figure 3A:
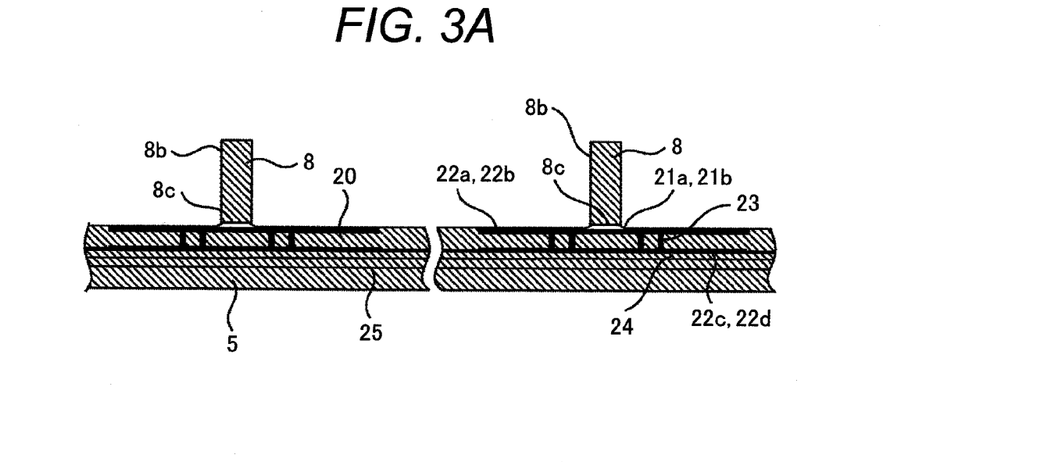
FIG. 3A is a sectional view of the wiring substrate of the device according to the first embodiment.

FIG. 3A is a sectional view of the LED 8 mounted on the wiring substrate 20, having the light guide plate shown in the sectional view of FIG. 2B omitted.

Figure 3B:
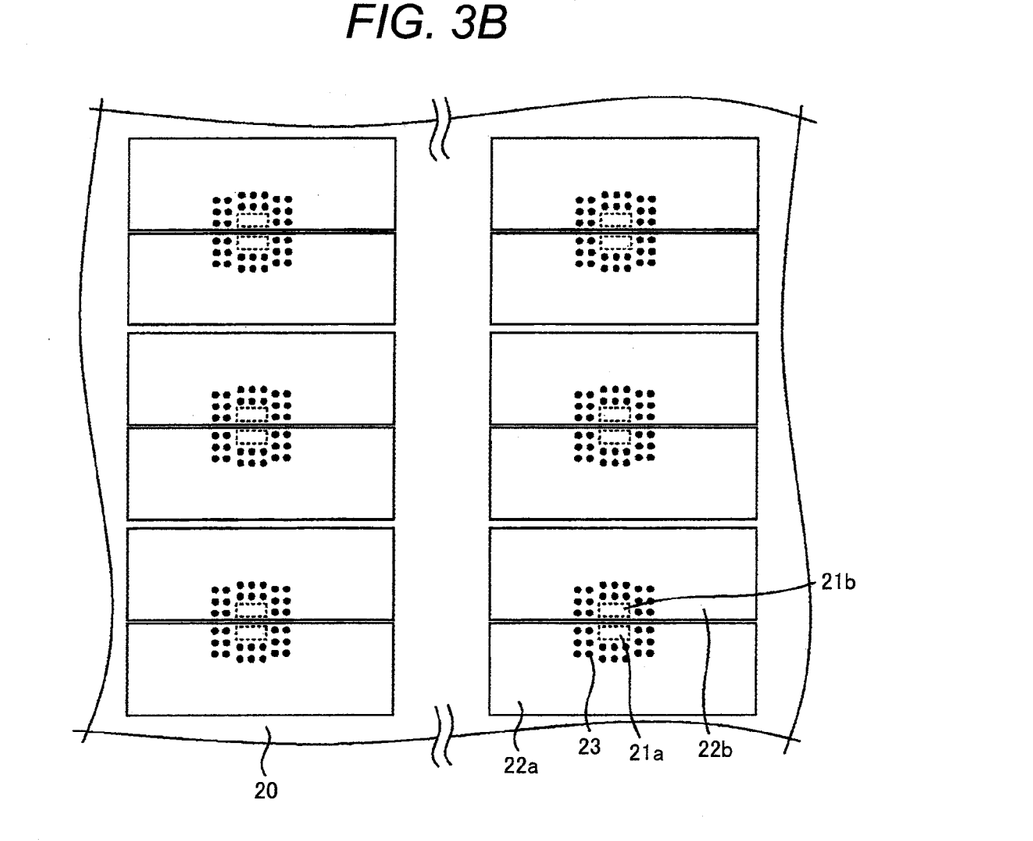
FIG. 3B is a front view of the wiring substrate of the device according to the first embodiment.

FIG. 3B illustrates an LED mount surface (before LED is mounted) of the wiring substrate 20.

In the embodiment, the LED 8 which has a package electrode (portion soldered to the wiring substrates) 8c formed on the surface perpendicular to a light output surface 8b of the package is used such that the LED mount surface of the wiring substrate 20 to which the LED 8 is mounted and soldered becomes perpendicular to the incident surface of the light guide plate 11. That is, the arrangement is made such that the light output surface of the light guide plate 11 becomes parallel to the LED mount surface of the wiring substrate 20.

The LED 8 may have a structure including plural groups of three-color light emitting elements of RGB. The group of the color other than RGB (for example, blue and yellow) may also be used. In the case where the light emitting elements of plural colors are used, the light source may be provided with an optical part for mixing colors emitted from the light emitting elements of different colors. Alternatively, plural light emitting elements of single color (for example, white) may be used.

Referring to FIG. 3A, the LED 8 has the surface perpendicular to the light output surface 8b soldered to electrode pads 21a, 21b on the wiring substrate 20 corresponding to the package electrode 8c of the LED. Copper wiring patterns 22a, 22b, and 22c, 22d each of which has the width larger than that of the electrode 8c, and includes areas of the electrode pads 21a and 21b are formed on the LED mount surface (upper surface) and the back surface of the wiring substrate 20 for feeding power to the LED 8. Each of the wiring patterns 22a, 22b on the upper surface, and the wiring patterns 22c, 22d on the back surface has substantially the same size, and those patterns on the upper surface are formed at the position opposite those on the back surface. The wiring patterns 22a, 22b on the upper surface are electrically and thermally connected to the wiring patterns 22c, 22d on the back surface via plural through holes 23. The through hole 23 is provided by forming a copper plating layer on a wall surface of a hole which penetrates the substrate so as to be connected to the copper wiring pattern formed on both upper and back surfaces of the substrate. The through holes 23 are two-dimensionally arranged in plural rows to surround the electrode pads 21a, 21b. The through holes are not formed in the electrode pads 21a, 21b for the reason to be described later.

A resist layer 24 with electrical insulation property is formed in both upper and back surfaces of the wiring substrate 20 provided with the wiring patterns and the through holes. Each of the electrode pads 21a, 21b is provided with a resist opening in accordance with the size of the LED electrode 8c. Accurate positioning of the opening allows positioning of the LED 8 to be held with high accuracy upon soldering of the LED 8 to the electrode pads 21a, 21b. In case of the soldering reflow, spread of the solder is limited only to the opening by the resist, and the position of the electrode 8c of the LED 8 is held at the spread position of the solder, that is, the position of the opening in the resist by the self alignment function of solder.

The through holes 23 are not formed in the electrode pads 21a, 21b so as to keep the flatness at the high level. The LED 8 may be soldered to the electrode pads 21a, 21b with high stability, and accordingly, the LED 8 is not slanted during mount operation. Especially when the light output surface 8b of the LED 8 is perpendicular to the mount surface of the wiring substrate 20, the LED 8 is mounted while being slanted, which is likely to dislocate the optical axis. It is therefore important to keep the flatness of the electrode pad.

The wiring substrate 20 is applied to a chassis 5 via a thermal conductive sheet 25 such that the wiring patterns 22c, 22d on the back surface of the wiring substrate 20 are thermally connected to the chassis 5 via the resist layer 24 and the thermal conductive sheet 25. It is preferable to set the width of the thermal conductive sheet 25 to be at least equal to or larger than the width of the wiring pattern. Depending on the amount of generated heat of the LED 8, the thin resin sheet may be employed as the thermal conductive sheet 25 without using the sheet with especially high thermal conductive rate.

Heat generated in the LED 8 diffuses in the plane direction through the wiring patterns 22a, 22b on the upper surface, and thermally conducted to the back surface via the through holes 23. The heat further diffuses in the plane direction through the wiring patterns 22c, 22d on the back surface. After the thermal conduction on both upper and back surfaces, heat is transferred to the chassis 5. The heat further diffuses inside the chassis 5, and is released. Substantially entire back surface of the wiring substrate 20 is connected to the chassis 5. It is therefore preferable to allow the through holes 23 to be formed around the electrode pads 21a, 21b to which the LED 8 is mounted as close as possible such that the heat of the LED 8 is transferred to the back surface over the distance as short as possible. It is preferable to set the area of the wiring pattern to be as large as possible.

Since the light output surface 8b of the LED 8 is perpendicularly positioned to the LED mount surface of the wiring substrate 20 (the light output surface of the light guide plate is parallel to the LED mount surface, that is, the display surface of the liquid crystal panel is parallel to the LED mount surface), the wiring substrate 20 may be directly attached to the surface of the chassis 5 only through the thermal conducting sheet 25, resulting in simplified assembly. The wiring substrate 20 may be attached to the chassis 5 with the vis, for example. The mount position of the LED 8 is accurately held with respect to the wiring substrate 20 as a reference. So the wiring substrate 20 is fixed to the predetermined position of the chassis 5 to allow all the LEDs 8 to be arranged with high positioning accuracy.

As described later, plural LED rows which constitute the light source unit 12 may be mounted on the single wiring substrate 20 as a whole. This makes it possible to reduce the number of the wiring substrates 20 for forming the backlight unit. In this case, assembling and LED positioning accuracy may further be improved.

Heat generated in the LED 8 diffuses through the wide wiring patterns 22a and 22b on the surface of the wiring substrate 20 (LED mount surface) from the electrode 8c directly into the wiring patterns two-dimensionally. As the wiring substrate surface on which the LED is mounted may be disposed parallel to the light output surface of the light guide plate 11, the size of the wiring substrate 20 may be set limitlessly such that the heat two-dimensionally diffuses by increasing each width of the wiring patterns 22a and 22b connected to the electrode pads 21a, 21b for the LED 8, respectively.

The plural through holes 23 formed around the LED 8 allow the thermal conduction to the wide wiring patterns 22c and 22d on the back surface where heat is two-dimensionally diffused. The wiring patterns 22a, 22b, 22c, and 22d on both upper and back surfaces of the wiring substrate 20 serve to diffuse heat to allow the substrate insulating layer between the wiring patterns on the upper surface and the back surface to serve as a sufficiently effective thermal conductive path from the upper surface to the back surface of the substrate. The area contributing to the heat conduction from the upper surface to the back surface of the substrate is enlarged, and accordingly, the heat resistance in the insulating layer is reduced.

In the embodiment, the resist layer 24 on the back surface of the substrate ensures the wiring patterns 22c and 22d on the back surface to be electrically insulated. This makes it possible to directly diffuse the heat through the wiring pattern for feeding power to the LED 8. As the electrode 8c of the LED 8 is directly connected to the heat generation source inside the package, the heat diffusion through the wiring pattern for feeding power to the LED is especially effective. The structure for diffusing the heat through the wiring patterns on both upper and back surfaces of the wiring substrate is capable of reducing the thermal resistance of the resist layer 24 on the back surface of the substrate as low as possible compared with the thermal resistance as a whole. The electric insulation is ensured to allow the use of the thinner sheet or conductive sheet formed of graphite, for example, upon thermal connection between the substrate and the chassis so as to further enhance the heat release efficiency.

Figure 4:
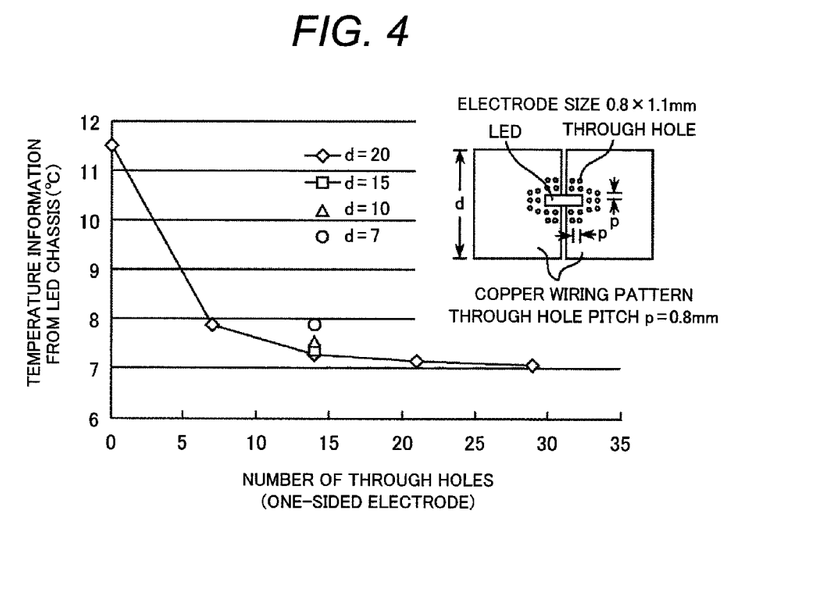
FIG. 4 is an explanatory view representing an advantage derived from the first embodiment.

FIG. 4 represents a correlation among the wiring pattern width, the number of through holes, and heat releasing performance.

FIG. 4 illustrates the correlation among the temperature rise from the LED electrode chassis, the wiring pattern width d, and the number of through holes in the case where the LEDs each having the heat generation amount set to 0.32 W and the electrode size of 0.8 mm×1.1 mm are arrayed on the wiring substrate with the thickness of 1 mm at a pitch of 20 mm.

Under the aforementioned condition, FIG. 4 clearly shows the effect that the heat releasing performance is improved as the increase in the number of the through holes around the electrode at one side in the range from 0 to 15. When the number of the through holes becomes approximately 15 or more, the effect becomes less influential. As 10 or more through holes are required to be formed near the electrode at one side, it is effective to arrange those through holes in plural rows over the entire periphery of the electrode as much as possible.

Meanwhile, the larger the wiring pattern width d becomes, the higher the heat releasing performance becomes. The width d becomes less influential when it becomes 10 mm or larger. That is, it is preferable to set the wiring pattern width to the value at least several or more times the width of the electrode.

With the aforementioned structure, heat generated in the LED is efficiently conducted from the back surface of the wiring substrate to the chassis. The heat is then diffused inside the chassis to provide high heat releasing performance. Unlike the down type structure, the process which accommodates incident light from the light guide plate side for reducing the thickness of the backlight unit according to the embodiment allows the light guide plate to be disposed adjacent to the LED mount surface of the wiring substrate.

The embodiment is structured to actively release heat to the back surface of the LED mount surface of the wiring substrate so as to avoid temperature rise of the light guide plate irrespective of being disposed adjacent to the LED mount surface. This makes it possible to suppress adverse influence resulting from the temperature rise of the light guide plate, which is exerted to the optical property and reliability.

Meanwhile, the light guide plate 11 has the side opposite the wiring substrate 20 slanted as shown in FIG. 2B and a thin portion 11b at one end with its thickness reduced as it is separated from a light incident surface 11a. A stepped portion 11c with its configuration corresponding to that of the thin portion 11b is formed around the light incident surface 11a of the light guide plate so as to allow the thin portion 11b at the end of the adjacent light guide plate to rest thereon. This makes it possible to simplify positioning of adjacent light guide plates 11 and to reduce unevenness in brightness on the boundary between the light guide plates 11.

In the case where the plural light source units 12 are mounted on the chassis 5, the plural LEDs 8 for forming the single light source unit 12 are set as a unit. Then plural units of the LED rows are mounted on the wiring substrate 20. The plural light guide plates 11 each for forming the light source unit 12 may be linked and integrally molded to form the light guide plate as a whole. Since the surface of the wiring substrate 20, on which the LED 8 is mounted may be disposed parallel to the light output surface of the light guide plate 11, the LEDs 8 to be mounted on the wiring substrate 20 may be mounted on the single substrate in the form of plural units of the LED rows. In this way, all the required LEDs may be mounted on the single wiring substrate.

The number of the wiring substrates to form the entire structure of the backlight unit, and the number of the linked light guide plates may be determined in consideration of the cost and assembling operation. This may simplify mount of all the light source units on the chassis. The number of assembling steps may be reduced, and accordingly, the backlight unit having the production cost reduced may be provided.

Figure 5:
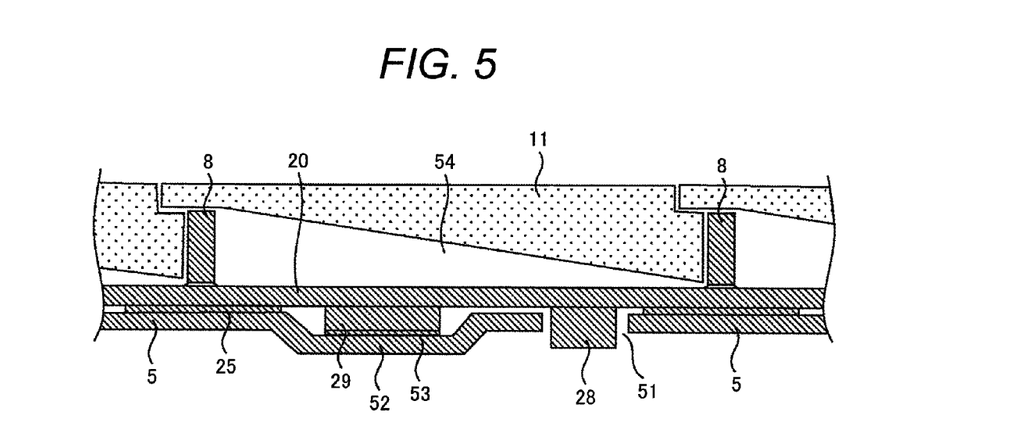
FIG. 5 is a sectional view of the first embodiment.

Connectors and various types of sensors to be connected to the control circuit for controlling lighting and illuminance of the LED 8 and such circuit parts as the driver element for driving the LED may be mounted on the back surface of the wiring substrate 20. In this case, a cut portion 51 as a part release may be formed in the chassis 5, which is configured in accordance with the shape of a mount part 28 as shown in FIG. 5.

The part especially requiring to have heat released among the aforementioned parts and elements, that is, an element 29 is allowed to have the heat released to the chassis 5 by subjecting a part of the chassis 5 to a squeezing process 52 in accordance with the size of the element 29 as the subject part so as to thermally connect the part, the element 29 and the squeezed part 52 via a heat conductive sheet 53. The part is mounted on the back surface of the wiring substrate 20 to allow the circuit part for driving the LED to be mounted on the same substrate 20 to which the LED is mounted. Those circuits do not have to be formed of a different substrate independent from the wiring substrate 20 on which the LED 8 is mounted, which is advantageous in the cost.

The area of the cut portion formed in the chassis 5 for releasing the part may be reduced so long as the LED drive circuit is at least partially mounted in the space 54 defined by the wiring substrate 20 and the light guide plate 11 at the LED mount surface side of the wiring substrate. This may contribute to the heat release of the LED 8. Likewise the case of the LED, the part to be mounted on the LED mount surface side, requiring heat release may have the heat released from the back surface of the substrate to the chassis through the wiring patterns on both upper and back surfaces of the wiring substrate and the through holes.

A second embodiment which relates to a mount operation of the wiring substrate according to the present invention will be described referring to FIGS. 6A to 6D.

In the first embodiment, the wiring substrate provided with the LED is directly screwed to the chassis. In this embodiment, the wiring substrate is attached to the chassis using a mount member.

FIGS. 6A to 6D are sectional views of the light source unit formed by mounting the wiring substrate 20 to the chassis 5 (described referring to FIGS. 2A and 2B).

Figure 6A:
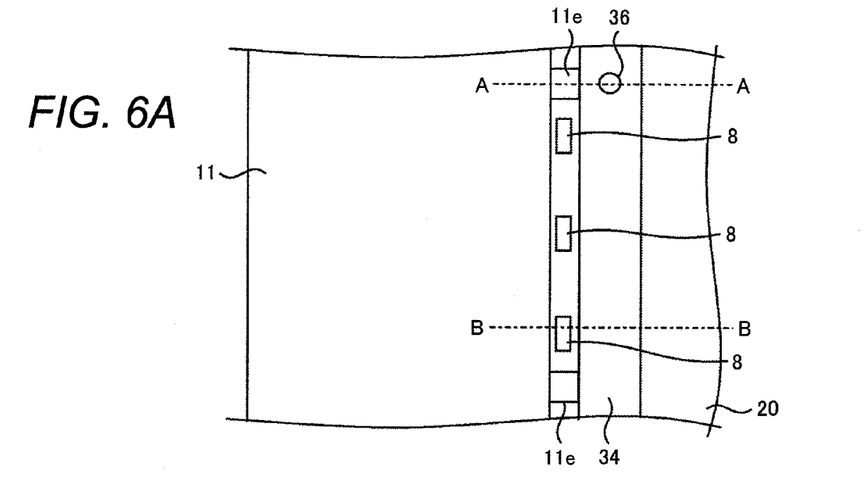
FIG. 6A is a front view of a light source unit according to a second embodiment.

FIG. 6A is a front sectional view seen from a direction of arrow B of FIG. 2B. FIG. 68 is a sectional view taken along line A-A of FIG. 6A, representing a cross section of a non-mount portion between the LEDs 8. FIG. 6C is a sectional view taken along line B-B of FIG. 6A, representing a cross section of a mount portion of the LED 8. The operation for mounting the LED to the wiring substrate, the structure of the wiring substrate, and the thermal conductive sheet provided between the wiring substrate and the chassis are the same as those described in the first embodiment.

Figure 6B:
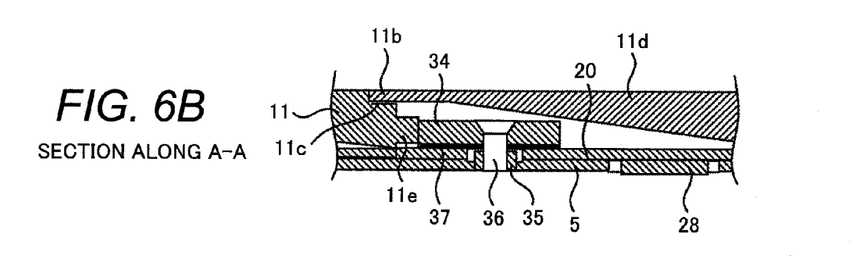
FIGS. 6B to 6D are sectional views of the light source unit according to the second embodiment.
Figure 6C:
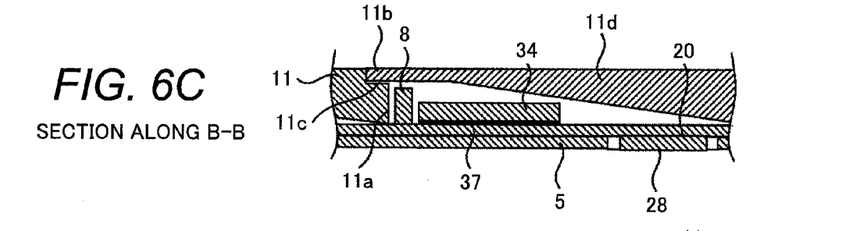

Referring to FIGS. 6B and 6C, a retainer plate 34 is used to fix the wiring substrate 20 and the chassis 5. The retainer plate 34 is attached around the LED rows by threading a screw 36 to a metal stud 35 formed in the chassis 5 while having a thermally conductive and electrically insulating sheet 37 interposed between the retainer plate 34 and the wiring substrate 20. The retainer plate 34 is formed of a metal that exhibits excellent thermal conductivity such as aluminum, and serves as a heat releasing member as well as a positioning member for defining the positional relationship between the LED 8 and the light guide plate 11. The retainer plate 34 is apart from the rows of the LEDs 8 at a predetermined distance, and disposed in accordance with the defined positional relationship therebetween.

The heat generated in the LED 8 is thermally diffused through the wiring patterns 22a, 22b and 22c, 22d on both upper and back surfaces of the wiring substrate 20, and is further thermally conducted from the back surface of the wiring substrate 20 to the chassis 5. The heat is diffused on both upper and back surfaces of the wiring substrate 20 to contribute the heat release over a wide area, resulting in high heat releasing performance.

Meanwhile, the retainer plate 34 disposed at the mount surface side of the LED 8 serves to thermally connect the wiring patterns 22a, 22b to the retainer plate 34 via the thermal conductive sheet 37, and accordingly, the retainer plate 34 further accelerates the thermal diffusion. The heat is conducted from the retainer plate 34 to the chassis 5 via the screw 36 and the metal stud 35 so as to form the heat release path from the upper surface (LED mount surface) of the wiring substrate 20 to the chassis 5. It is preferable to increase the number of fixing positions of the retainer plate 34 with the screws 36 as large as possible.

Accompanied with increase in the number of fixing positions, the number of the heat paths from the retainer plate 34 to the chassis 5 via the screw 36 is increased. Furthermore, as the contact pressure among the retainer plate 34, the wiring substrate 20 and the chassis 5 is increased, the thermal resistance is reduced. Besides the heat release path from the back surface of the wiring substrate to the chassis, the heat path from the upper surface of the wiring substrate to the chassis 5 is formed via the retainer plate 34 to provide high heat releasing performance. The thermal conductive sheet is interposed between the surface of the LED 8 opposite the light output surface and the side surface of the retainer plate 34 to allow part of the heat in the LED 8 to be directly conducted to the retainer plate 34.

Figure 6D:
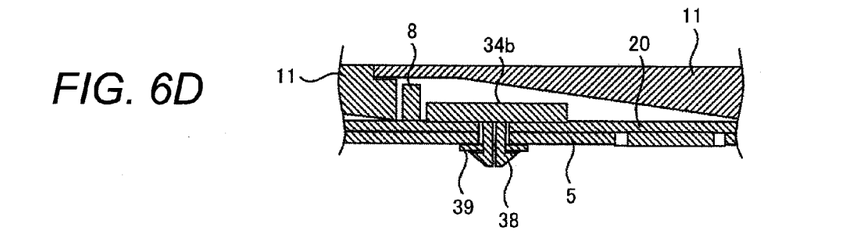

The retainer plate may be formed as an electrically insulating white plate member 34b formed of a resin material only for fixing the wiring substrate 20 and positioning/fixing the light guide plate 11 depending on the heat generation amount of the LED 8. Referring to FIG. 6D, the retainer plate 34b is provided with a claw 38 which penetrates the wiring substrate 20 and the chassis 5. The retainer plate 34b is engaged by penetrating the claw 38 through the wiring substrate 20 and the chassis 5 so that the claw 38 expands on the back surface of the chassis 5 to fix the wiring substrate 20 thereto.

Such element as a spring and a spring washer 39 may be interposed between the chassis 5 and the claw 38 for the purpose of generating the retaining force between the wiring substrate 20 and the chassis (for improving the heat releasing performance).

As illustrated in FIGS. 6B and 6C, the light guide plate 11 has the side opposite the chassis 5 slanted to have the thickness reduced as it is separated from the light incident surface 11a, and has the thin portion at the end. A stepped portion 11c configured corresponding to the shape of the thin portion 11b is formed adjacent to the light incident surface 11a of the light guide plate such that the thin portion 11b at the end of the adjacent light guide plates is rested thereon. This makes it possible to suppress uneven brightness at the boundary between the adjacent light guide plates 11. The light guide plate 11 is attached to the chassis 5 with respect to the retainer plate 34 as the reference. For example, plural convex portions 11e are formed on the light incident surface 11a of the light guide plate 11 at two or more positions. Those convex portions 11e may be brought into contact with and attached to the side of the retainer plate 34 in contact with the wiring substrate 20 as shown in FIG. 6B.

The convex portion 11e may be integrally formed with the light guide plate 11, or formed separately therefrom. The light guide plate 11 may be positioned to the retainer plate 34 by engaging a protrusion partially formed on one of the light guide plate 11 and the retainer plate 34 with a recess portion corresponding to the protrusion formed in the other of the light guide plate 11 and the retainer plate 34.

As light usage efficiency of the light source may be defined by the positional relationship between the LED and the light guide plate, the positional relationship between the LED and the light guide plate has to be accurately determined. In the embodiment, the LED 8 and the light guide plate 11 are positioned with respect to the retainer plate 34 as the reference, which makes it possible to easily determine the positional relationship between the LED and the light guide plate.

Especially when the light source unit is divided and arrayed, the positional relationship between the LED and the light guide plate has to be accurately determined for all the light source units. As a result, easy positioning is important for improving the productivity. As the retainer plate functions as the heat release promoting member, the heat release performance and the positioning capability of the light source may be improved simultaneously, resulting in the effects of easy assembly and improved productivity. The present invention provides the backlight unit for not only providing excellent heat releasing performance but also suppressing the production costs.

The light guide plate may be arranged around the LED with no need of being fixed in consideration of thermal expansion. In spite of vibration during transportation of the liquid crystal display device, the light incident surface 11a of the light guide plate and the LED 8a are not hit with each other because motion of the convex portion 11e of the light guide plate 11 is suppressed by the retainer plate 34 (see FIG. 6C). The LED may be protected from being damaged such as breakage.

The liquid crystal display device according to the present invention includes a light source unit formed by combining a light source for releasing light rays parallel to the display surface of the liquid crystal panel and a light guide plate which exhibits transmission property for guiding the light rays from the light source toward the direction of the liquid crystal panel, and a metal chassis for holding or supporting the light source unit. The light source is formed of plural light emitting elements mounted on the wiring substrate. The light emitting elements are thermally connected to the metal chassis via wiring patterns formed on the wiring substrate for feeding power to the light emitting elements.

The light guide plate has one side surface serving as a light incident surface for receiving the incident light from the light source. The light emitting element is disposed to have the light output surface directed perpendicular to the light emitting element mount surface of the wiring substrate. Then the light guide plate is attached to the metal chassis such that the light emitting element mount surface of the wiring substrate is perpendicular to the light incident surface of the light guide plate. The wiring patterns each of which has the width larger than that of the electrode and includes an electrode pad are formed on both upper and back surfaces of the wiring substrate at the electrode pad to which the power feeding electrode of the light emitting element is soldered. The wiring patterns formed on both upper and back surfaces of the wiring substrate are electrically and thermally connected via the through holes arranged in plural rows around the electrode pad so as not to be formed therein. Among the wiring patterns on both upper and back surfaces of the wiring substrate, the wiring pattern on the surface different from the light emitting element mount surface is thermally connected to the metal chassis. The plural light source units are arrayed in rows at the back surface side of the liquid crystal panel in the horizontal or vertical direction of the liquid crystal panel in accordance with the screen size.

What is claimed is:
1. A liquid crystal display device which includes a liquid crystal panel, a light source unit formed by combining a light guide plate which accommodates light rays from a side surface for illuminating a back surface of the liquid crystal panel with a light source, and a chassis for holding the light source unit, wherein:

the light source is formed by mounting plural light emitting elements each provided with a power feeding electrode on a surface perpendicular to a light output surface on a wiring substrate;

the wiring substrate is provided with an electrode pad connected to an electrode of the light emitting element, a wiring pattern which includes the electrode pad, having a width larger than that of the electrode pad, and is formed on both upper and back surfaces of the substrate, and through holes formed around the electrode pad in plural rows for connecting the wiring patterns formed on both the upper and back surfaces of the substrate; and the wiring patterns on both the upper and back surfaces of the wiring substrate, which is on a surface different from a light emitting element mount surface is thermally connected to the chassis.

2. The liquid crystal display device according to claim 1, wherein the width of the wiring pattern formed on both the upper and back surfaces of the wiring substrate is at least several times the width of the electrode of the light emitting element, and the wiring patterns each with the same shape are formed at corresponding positions on both the upper and back surfaces, respectively.

3. The liquid crystal display device according to claim 1, wherein the through holes are arranged so as not to be formed in the electrode pad.

4. The liquid crystal display device according to claim 1, wherein:

the light source for forming the light source unit is formed of a row of the linearly arranged light emitting elements as a unit;

one or more units of the light emitting element rows are two dimensionally arranged and mounted on the same wiring substrate; and plural wiring substrates are attached to the chassis by arranging so that the light emitting element mount surface is positioned parallel to a display surface of the liquid crystal panel.

* * * * *